United States Patent
Wang et al.

(10) Patent No.: US 9,246,728 B2
(45) Date of Patent: *Jan. 26, 2016

(54) SYSTEM AND METHOD FOR FREQUENCY DIVERSITY

(71) Applicant: QUALCOMM Incorporated, San Diego, CA (US)

(72) Inventors: Michael Mao Wang, San Diego, CA (US); Murali Ramaswamy Chari, San Diego, CA (US); Ashok Mantravadi, San Diego, CA (US); Fuyun Ling, San Diego, CA (US); Rajiv Vijayan, San Diego, CA (US); Raghuraman Krishnamoorthi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 92 days.

This patent is subject to a terminal disclaimer.

(21) Appl. No.: 13/767,834

(22) Filed: Feb. 14, 2013

(65) Prior Publication Data

US 2013/0156124 A1    Jun. 20, 2013

Related U.S. Application Data

(63) Continuation of application No. 11/929,927, filed on Oct. 30, 2007, now abandoned, which is a continuation-in-part of application No. 11/192,789, filed on Jul. 29, 2005, now Pat. No. 8,189,539.

(60) Provisional application No. 60/951,949, filed on Jul. 25, 2007, provisional application No. 60/592,999, filed on Jul. 29, 2004.

(51) Int. Cl.
*H04B 7/216* (2006.01)
*H04L 27/26* (2006.01)
(Continued)

(52) U.S. Cl.
CPC ......... *H04L 27/2601* (2013.01); *H03M 13/258* (2013.01); *H03M 13/271* (2013.01);
(Continued)

(58) Field of Classification Search
CPC .............................. H04B 14/006; H04B 1/034
USPC ................................ 455/23, 42; 370/335, 343
See application file for complete search history.

(56) References Cited

U.S. PATENT DOCUMENTS

| 5,177,766 A | 1/1993 | Holland et al. |
| 5,315,592 A | 5/1994 | Conant et al. |

(Continued)

FOREIGN PATENT DOCUMENTS

| CN | 1345493 A | 4/2002 |
| CN | 1348310 A | 5/2002 |

(Continued)

OTHER PUBLICATIONS

Daza V., et al., "A Distributed and Computationally Secure Key Distribution Scheme", Information Security, Lecture Notes in Computer Science, vol. 2433, 2002, pp. 342-356.

(Continued)

*Primary Examiner* — Temica M Beamer
(74) *Attorney, Agent, or Firm* — Arent Fox LLP

(57) ABSTRACT

A system and method for frequency diversity uses interleaving in a wireless communication system utilizing orthogonal frequency division multiplexing (OFDM) with various FFT sizes. Subcarriers of one or more interlaces are interleaved in a bit reversal fashion and the one or more interlaces are interleaved in the bit reversal fashion.

25 Claims, 10 Drawing Sheets

(51) Int. Cl.
*H04L 1/00* (2006.01)
*H03M 13/27* (2006.01)
*H03M 13/31* (2006.01)
*H03M 13/25* (2006.01)
*H04L 5/00* (2006.01)
*H03M 13/29* (2006.01)
*H04L 1/04* (2006.01)

(52) U.S. Cl.
CPC .............. *H03M13/31* (2013.01); *H04L 1/0071* (2013.01); *H04L 5/0044* (2013.01); *H04L 5/0064* (2013.01); *H04L 5/0083* (2013.01); *H04L 27/2626* (2013.01); *H04L 27/2634* (2013.01); *H03M 13/2957* (2013.01); *H04L 1/04* (2013.01); *H04L 5/0007* (2013.01); *H04L 5/0042* (2013.01)

(56) References Cited

U.S. PATENT DOCUMENTS

| | | |
|---|---|---|
| 5,943,330 A | 8/1999 | Hottinen |
| 6,145,111 A | 11/2000 | Crozier et al. |
| 6,154,484 A | 11/2000 | Lee et al. |
| 6,172,993 B1 | 1/2001 | Kim et al. |
| 6,208,663 B1 | 3/2001 | Schramm et al. |
| 6,243,379 B1 | 6/2001 | Veerina et al. |
| 6,298,463 B1 | 10/2001 | Bingeman et al. |
| 6,304,581 B1 | 10/2001 | Chen et al. |
| 6,311,306 B1 | 10/2001 | White et al. |
| 6,392,572 B1 | 5/2002 | Shiu et al. |
| 6,421,333 B1 | 7/2002 | Jalali |
| 6,505,052 B1 | 1/2003 | Jou |
| 6,580,497 B1 | 6/2003 | Asaka et al. |
| 6,597,726 B2 | 7/2003 | Ozluturk |
| 6,611,551 B1 | 8/2003 | Jones, IV et al. |
| 6,667,962 B1 | 12/2003 | Lee et al. |
| 6,697,990 B2 | 2/2004 | El-Gamal et al. |
| 6,738,370 B2 | 5/2004 | Ostman |
| 6,747,948 B1 | 6/2004 | Sarraf et al. |
| 6,754,170 B1 | 6/2004 | Ward |
| 6,807,428 B2 | 10/2004 | Casaccia |
| 6,956,842 B1 | 10/2005 | Okumura et al. |
| 6,961,388 B2 | 11/2005 | Ling et al. |
| 6,973,118 B1 | 12/2005 | Ikeda et al. |
| 7,002,900 B2 | 2/2006 | Walton et al. |
| 7,031,251 B2 | 4/2006 | Chen et al. |
| 7,039,000 B2 | 5/2006 | You et al. |
| 7,093,185 B2 | 8/2006 | Kim et al. |
| 7,120,696 B1 | 10/2006 | Au et al. |
| 7,145,940 B2 | 12/2006 | Gore et al. |
| 7,154,936 B2 | 12/2006 | Bjerke et al. |
| 7,170,849 B1 | 1/2007 | Arivoli et al. |
| 7,248,652 B2 | 7/2007 | Sayeed |
| 7,251,282 B2 | 7/2007 | Maltsev et al. |
| 7,251,768 B2 | 7/2007 | Giannakis et al. |
| 7,289,459 B2 | 10/2007 | Hayashi et al. |
| 7,292,552 B2 | 11/2007 | Willenegger et al. |
| 7,298,787 B2 | 11/2007 | Priotti |
| 7,324,590 B2 | 1/2008 | Abrishamkar et al. |
| 7,339,999 B2 | 3/2008 | Gore et al. |
| 7,411,898 B2 | 8/2008 | Erlich et al. |
| 7,457,350 B2 | 11/2008 | Baker et al. |
| 7,583,584 B2 | 9/2009 | Wang et al. |
| 7,693,124 B2 | 4/2010 | Subrahmanyam et al. |
| 7,782,806 B2 | 8/2010 | Vrcelj et al. |
| 7,813,383 B2 | 10/2010 | Wang et al. |
| 8,189,539 B2 | 5/2012 | Wang et al. |
| 8,391,410 B2 | 3/2013 | Wang |
| 2001/0034868 A1 | 10/2001 | El-Gamal et al. |
| 2002/0122383 A1 | 9/2002 | Wu et al. |
| 2002/0131481 A1 | 9/2002 | Ozluturk |
| 2002/0150181 A1 | 10/2002 | Sayeed |
| 2002/0167924 A1 | 11/2002 | Agrawal et al. |
| 2003/0007466 A1 | 1/2003 | Chen |
| 2003/0142730 A1 | 7/2003 | Lin |
| 2003/0174686 A1 | 9/2003 | Willenegger et al. |
| 2004/0028004 A1 | 2/2004 | Hayashi et al. |
| 2004/0081131 A1 | 4/2004 | Walton et al. |
| 2004/0199846 A1 | 10/2004 | Matsumoto et al. |
| 2004/0203885 A1 | 10/2004 | Quaid |
| 2004/0218570 A1 | 11/2004 | Black et al. |
| 2004/0240538 A1 | 12/2004 | Abrishamkar et al. |
| 2005/0016201 A1 | 1/2005 | Ivanov et al. |
| 2005/0063298 A1 | 3/2005 | Ling et al. |
| 2005/0111524 A1 | 5/2005 | Baker et al. |
| 2005/0122928 A1 | 6/2005 | Vijayan et al. |
| 2005/0135308 A1 | 6/2005 | Vijayan et al. |
| 2005/0135517 A1 | 6/2005 | Coffey et al. |
| 2005/0195763 A1 | 9/2005 | Kadous et al. |
| 2005/0243939 A1 | 11/2005 | Jung et al. |
| 2005/0286611 A1 | 12/2005 | Priotti |
| 2006/0034163 A1 | 2/2006 | Gore et al. |
| 2006/0109781 A1 | 5/2006 | Wang et al. |
| 2006/0117167 A1 | 6/2006 | Evrard et al. |
| 2006/0123310 A1 | 6/2006 | Wang et al. |
| 2006/0133388 A1 | 6/2006 | Wang et al. |
| 2006/0209927 A1 | 9/2006 | Khandekar et al. |
| 2006/0215538 A1 | 9/2006 | Murthy et al. |
| 2006/0280228 A1 | 12/2006 | Daniele et al. |
| 2007/0025738 A1 | 2/2007 | Moore |
| 2007/0036065 A1 | 2/2007 | Wang |
| 2007/0081484 A1 | 4/2007 | Wang |
| 2007/0082696 A1 | 4/2007 | Wang |
| 2007/0232251 A1 | 10/2007 | Murthy et al. |
| 2008/0317142 A1 | 12/2008 | Wang et al. |
| 2009/0161776 A1 | 6/2009 | Wang et al. |

FOREIGN PATENT DOCUMENTS

| | | |
|---|---|---|
| EP | 0938208 | 8/1999 |
| EP | 1222828 A1 | 7/2002 |
| EP | 1304812 A1 | 4/2003 |
| JP | 09261209 | 10/1997 |
| JP | 10210000 A | 8/1998 |
| JP | 2000013356 A | 1/2000 |
| JP | 2000031838 A | 1/2000 |
| JP | 2000068975 | 3/2000 |
| JP | 2001217861 | 8/2001 |
| JP | 2001268048 A | 9/2001 |
| JP | 2001320345 A | 11/2001 |
| JP | 2001339657 A | 12/2001 |
| JP | 2002057640 A | 2/2002 |
| JP | 2002111621 A | 4/2002 |
| JP | 2002111631 A | 4/2002 |
| JP | 2002217894 A | 8/2002 |
| JP | 2003124904 A | 4/2003 |
| JP | 2003518816 T | 6/2003 |
| JP | 2003188848 A | 7/2003 |
| JP | 2003521842 A | 7/2003 |
| JP | 2003524330 A | 8/2003 |
| JP | 2003524929 A | 8/2003 |
| JP | 2003309535 A | 10/2003 |
| JP | 2004032711 A | 1/2004 |
| JP | 2004048676 A | 2/2004 |
| JP | 2004133801 A | 4/2004 |
| JP | 2005536097 T | 11/2005 |
| KR | 20010088148 | 9/2001 |
| KR | 200461482 | 7/2004 |
| NZ | 211474 A | 2/1989 |
| NZ | 503592 A | 2/2002 |
| RU | 2134017 C1 | 7/1999 |
| RU | 2137310 C1 | 9/1999 |
| RU | 2178953 C2 | 1/2002 |
| RU | 2003109329 A | 1/2005 |
| SU | 1327296 A1 | 7/1987 |
| TW | I228893 | 3/2005 |
| TW | I244349 | 11/2005 |
| WO | 0034799 A1 | 6/2000 |
| WO | 0035102 A1 | 6/2000 |
| WO | 0036208 A1 | 6/2000 |
| WO | 0049780 A1 | 8/2000 |
| WO | 0065726 | 11/2000 |
| WO | 0074248 A1 | 12/2000 |

(56) References Cited

FOREIGN PATENT DOCUMENTS

| WO | 0105059 A1 | 1/2001 |
|---|---|---|
| WO | 0147157 A2 | 6/2001 |
| WO | 02099994 A1 | 12/2002 |
| WO | 03058823 A1 | 7/2003 |
| WO | 03079576 | 9/2003 |
| WO | 03081938 A1 | 10/2003 |
| WO | 2004015948 A1 | 2/2004 |
| WO | 2004082200 A1 | 9/2004 |
| WO | 2005076558 | 8/2005 |
| WO | 2005076641 A1 | 8/2005 |
| WO | 2005114940 A1 | 12/2005 |
| WO | 2006015269 A1 | 2/2006 |
| WO | 2006016212 A1 | 2/2006 |
| WO | 2006086878 A1 | 8/2006 |
| WO | 2009015330 A2 | 1/2009 |

OTHER PUBLICATIONS

International Search Report and Written Opinion—PCT/US2014/015860—ISA/EPO—Jun. 12, 2014.
Takahashi, Y., "Image Information Media towards the 21st Century," Journal of the Institute of Image Information and Television Engineers, Japan, The Institute of Image Information and Television Engineers, Jan. 2000, vol. 54, No. 1, pp. 14-20.
Arshad K et al: "Performance of Wireless OFDM System Channel Estimation with Different Pilot Patterns" Spread Spectrum Techniques and Applications, 2004 IEEE Eighth International Symposium on Sydney, Australia Aug. 30,-Sep. 2, 2004, Piscataway, NJ, USA, IEEE, Aug. 30, 2004, pp. 179-183, XP010754933.
Chari M.R., et al., "FLO Physical Layer: An Overview" IEEE transactions on Broadcasting, Mar. 1, 2007, pp. 145-160, vol. 53 (1), XP011172013, IEEE Service Center, Piscataway, NJ, US, Issn: 0018-9316, Abstract; Figures 8,11,13, Sections IV.C.4), IV.C.8), IV.C.9 Standards.
Comsa C et al: "System level design of baseband OFDM for wireless LAN" Signals, Circuits and Systems, 2003. SCS 2003. International Symposium on Jul. 10-11, 2003, Piscataway, NJ, USA, IEEE, vol. 1, Jul. 10, 2003, pp. 313-316, XP010654936.
Eroz et al.: "On the Design of Prunable Interleavers for Turbo codes," IEEE Vehicular Technology Conference, pp. 1669-1673, XP010342111 (1999).
European Search Report—EP12176160—Search Authority—The Hague—Jul. 30, 2012.
"Forward Link Only Air Interface Specification for Terrestrial Mobile Multimedia Multicast: TIA-1099" EIMIA Standards, Telecomm. Industry Assoc., Aug. 1, 2006, XP017005609, Arlington, VA, Secs. 5.2.1.2.9.2.7, 5.2.1.2.9.2.8, 5.2.1.2.10.
Hill "A First Course on Coding Theory", 1986 Oxford University Press, Chapter 2, pp. 11-13.
International Preliminary Examination Report PCT/US07/077031, WIPO Geneva Switzerland, Mar. 3, 2009.
International Preliminary Report on Patentability—PCT/US07/079785—European Patent Office—Berlin—Apr. 9, 2009.
International Preliminary Report on Patentability—PCT/US07/079785—The International Bureau of WIPO—Geneva, Switzerland—Mar. 31, 2009.
International Preliminary Report on Patentability—PCT/US07/079787—European Patent Office—Berlin—Apr. 9, 2009.
International Preliminary Report on Patentability—PCT/US2005/027106, International Search Authority—IPEA/US—Jul. 3, 2008.
International Preliminary Report on Patentability—PCT/US2005/027104, International Bureau of WIPO—Geneva, Switzerland—Jan. 30, 2007.
International Search Report—PCT/US05/027104, International Search Authority—European Patent Office—Mar. 7, 2006.
International Search Report—PCT/US05/027105, International Search Authority—European Patent Office—Nov. 29, 2005.
International Search Report—PCT/US05/027106, International Search Authority—European Patent Office—Nov. 14, 2005.
International Search Report—PCT/US07/077031, International Search Authority—European Patent Office—May 19, 2008.
International Search Report—PCT/US07/079785, International Search Authority—European Patent Office—Mar. 6, 2008.
International Search Report—PCT/US07/079787, International Search Authority—European Patent Office—Feb. 27, 2008.
International Search Report, PCT/US2008/071168, International Searching Authority, European Patent Office, Jun. 17, 2009.
Muramatsu et al.:"Perfect reconstruction deinterlacer banks for field scalable video compression," International Conference on Image Processing, pp. 2279-2282, XP010786240 (2004).
Nevdyaev L.M., "Telecommunication Technologies," 2002, pp. 347, Moscow, Communication and Business.
Parthasarathy et al.: "Reliable transmission of high-quality video over ATM networks," IEEE Transactions on Image Processing, vol. 8, No. 3, XP011026288 (Mar. 1999).
Patterson & Hennessey, "Computer Organization and Design" 1994, Morgan Kaufmann Publishers, Figure 5.11 and description thereof and discussion, pp. 280-285.
Taiwan Search Report—TW096131937—TIPO—May 2, 2011.
Taiwan Search Report—TW096136065—TIPO—Jan. 31, 2011.
Taiwan Search Report—TW096136065—TIPO—May 24, 2012.
Taiwan Search Report—TW097128538—TIPO—Mar. 27, 2012.
Taiwan Search Report—TW096135972—TIPO—Sep. 7, 2011.
TIA: "Forward Link Only Air Interface Specification" Rev. 1.1, Physical Layer, FLO Forum Technical Contribution to TR47, Dec. 22, 2005, pp. 5-8 to 5-24.
TIA:"Forward Link Only Air Interface Specification Rev. 1.1", FLO Forum Technical Contribution to TR47, pp. 1-1 to 6-2, Dec. 22, 2005.
Written Opinion—PCT/US07/079785, International Search Authority—European Patent Office—Mar. 6, 2008.
Written Opinion—PCT/US07/079787, International Search Authority—European Patent Office—Feb. 27, 2008.
Written Opinion—PCT/US2007/077031, International Search Authority, European Patent Office, May 19, 2008.
Written Opinion—PCT/US2005/027106, International Search Authority—European Patent Office—Nov. 14, 2005.
Written Opinion, PCT/US2008/071168, International Searching Authority, European Patent Office, Jun. 17, 2009.
Written Opinion—PCT/US2005/027104, International Searching Authority—European Patent Office—Mar. 7, 2006.
Written Opinion—PCT/US2005/027105, International Searching Authority—European Patent Office—Nov. 29, 2005.
Zhongren Cao et al.: "Efficient Structure-Based Carrier Frequency Offset Estimation for Interleaved OFDMA Uplink," IEEE, pp. 3361-3365, XP-010643069, 2003.
Li Y., "Pilot-symbol-aided channel estimation for OFDM in wireless systems", IEEE Transactions on Vehicular Technology, vol. 49, No. 4, Jul. 2000, ISSN : 0018-9545, INSPEC Accession No. 6751663, DOI: 10.1109/25.875230 ,pp. 1207-1215.
Translation of First Office Action from counterpart Japanese Application No. 2013-118480, dated Jul. 8, 2014, 2 pages.
European Office Action dated Nov. 26, 2014, for European Patent Application Serial No. 07841502.3, 6 pages.
Notification of Reexamination in Chinese Application No. 200780036041.4 dated Jan. 16, 2015, 19 pages.
Notification of the First Office Action from Chinese Patent Office date Oct. 17, 2014 for the corresponding Chinese patent application No. 201210524314.2.
ETSI TS 125 212 v6.2.0; "Universal Mobile Telecommunications System (UMTS); Multiplexing and channel coding (FDD)", 3GPP TS 25.212 version 6.2.0 Release 6 (Jun. 2004), pp. 1-76.
European Office Action dated Jul. 14, 2015, for European Patent Application No. 12176160.5, 6 pages.
European Office Action dated Jul. 28, 2015, for European Patent Application No. 05777259.2, 6 pages.

SYSTEM AND METHOD FOR FREQUENCY DIVERSITY

RELATED APPLICATIONS

The present application for patent is a continuation of application Ser. No. 11/929,927 entitled "SYSTEM AND METHOD FOR FREQUENCY DIVERSITY" filed Oct. 30, 2007, assigned to the assignee hereof, which claims priority to Provisional Application No. 60/951,949 entitled "SYSTEM AND METHOD FOR FREQUENCY DIVERSITY" filed Jul. 25, 2007, and assigned to the assignee hereof, which is a continuation-in-part of application Ser. No. 11/192,789 entitled "SYSTEM AND METHOD FOR FREQUENCY DIVERSITY" filed Jul. 29, 2005, assigned to the assignee hereof, which claims priority to Provisional Application No. 60/592,999 entitled "METHOD OF CHANNEL INTERLEAVING IN A OFDM WIRELESS COMMUNICATIONS SYSTEM" filed Jul. 29, 2004, and assigned to the assignee hereof, all of which are hereby expressly incorporated by reference herein.

REFERENCE TO CO-PENDING APPLICATIONS FOR PATENT

The present Application for Patent is related to the following U.S. Patent Applications:

"SYSTEM AND METHOD FOR MODULATION DIVERSITY" having application Ser. No. 11/192,788 filed Jul. 29, 2005, assigned to the assignee hereof, and expressly incorporated by reference herein; and "SYSTEM AND METHOD FOR TIME DIVERSITY" having application Ser. No. 11/193,053 filed Jul. 29, 2005, assigned to the assignee hereof, and expressly incorporated by reference herein.

BACKGROUND

1. Field

The present disclosed aspects relates generally to wireless communications, and more specifically to channel interleaving in a wireless communications system.

2. Background

Orthogonal frequency division multiplexing (OFDM) is a technique for broadcasting high rate digital signals. In OFDM systems, a single high rate data stream is divided into several parallel low rate substreams, with each substream being used to modulate a respective subcarrier frequency. It should be noted that although the present disclosure is described in terms of quadrature amplitude modulation, it is equally applicable to phase shift keyed modulation systems.

The modulation technique used in OFDM systems is referred to as quadrature amplitude modulation (QAM), in which both the phase and the amplitude of the carrier frequency are modulated. In QAM modulation, complex QAM symbols are generated from plural data bits, with each symbol including a real number term and an imaginary number term and with each symbol representing the plural data bits from which it was generated. A plurality of QAM bits are transmitted together in a pattern that can be graphically represented by a complex plane. Typically, the pattern is referred to as a "constellation". By using QAM modulation, an OFDM system can improve its efficiency.

It happens that when a signal is broadcast, it can propagate to a receiver by more than one path. For example, a signal from a single transmitter can propagate along a straight line to a receiver, and it can also be reflected off of physical objects to propagate along a different path to the receiver. Moreover, it happens that when a system uses a so-called "cellular" broadcasting technique to increase spectral efficiency, a signal intended for a received might be broadcast by more than one transmitter. Hence, the same signal will be transmitted to the receiver along more than one path. Such parallel propagation of signals, whether man-made (i.e., caused by broadcasting the same signal from more than one transmitter) or natural (i.e., caused by echoes) is referred to as "multipath". It can be readily appreciated that while cellular digital broadcasting is spectrally efficient, provisions must be made to effectively address multipath considerations.

Fortunately, OFDM systems that use QAM modulation are more effective in the presence of multipath conditions (which, as stated above, must arise when cellular broadcasting techniques are used) than are QAM modulation techniques in which only a single carrier frequency is used. More particularly, in single carrier QAM systems, a complex equalizer must be used to equalize channels that have echoes as strong as the primary path, and such equalization is difficult to execute. In contrast, in OFDM systems the need for complex equalizers can be eliminated altogether simply by inserting a guard interval of appropriate length at the beginning of each symbol. Accordingly, OFDM systems that use QAM modulation are preferred when multipath conditions are expected.

In a typical trellis coding scheme, the data stream is encoded with a convolutional encoder and then successive bits are combined in a bit group that will become a QAM symbol. Several bits are in a group, with the number of bits per group being defined by an integer "m" (hence, each group is referred to as having an "m-ary" dimension). Typically, the value of "m" is four, five, six, or seven, although it can be more or less.

After grouping the bits into multi-bit symbols, the symbols are interleaved. By "interleaving" is meant that the symbol stream is rearranged in sequence, to thereby randomize potential errors caused by channel degradation. To illustrate, suppose five words are to be transmitted. If, during transmission of a non-interleaved signal, a temporary channel disturbance occurs. Under these circumstances, an entire word can be lost before the channel disturbance abates, and it can be difficult if not impossible to know what information had been conveyed by the lost word.

In contrast, if the letters of the five words are sequentially rearranged (i.e., "interleaved") prior to transmission and a channel disturbance occurs, several letters might be lost, perhaps one letter per word. Upon decoding the rearranged letters, however, all five words would appear, albeit with several of the words missing letters. It will be readily appreciated that under these circumstances, it would be relatively easy for a digital decoder to recover the data substantially in its entirety. After interleaving the m-ary symbols, the symbols are mapped to complex symbols using QAM principles noted above, multiplexed into their respective sub-carrier channels, and transmitted.

SUMMARY

One aspect of the disclosure is directed to a method for interleaving in a wireless communication system utilizing orthogonal frequency division multiplexing (OFDM) with various FFT sizes. The method comprises interleaving sub-carriers of one or more interlaces in a bit reversal fashion, and interleaving the one or more interlaces.

Another aspect of the disclosure is directed to an apparatus for interleaving in a wireless communication system utilizing orthogonal frequency division multiplexing (OFDM) with various FFT sizes. The apparatus comprises a processor configured to interleave subcarriers of one or more interlaces in a bit reversal fashion, and a processor configured to interleave the one or more interlaces in the bit reversal fashion.

Yet another aspect of the disclosure is directed to a processor executing instructions in a wireless communication system utilizing orthogonal frequency division multiplexing (OFDM) with various FFT sizes. The instructions comprise interleaving subcarriers of one or more interlaces in a bit reversal fashion, and interleaving the one or more interlaces in the bit reversal fashion.

Yet another aspect of the disclosure is directed to a computer-readable medium storing instructions for interleaving in a wireless communication system utilizing orthogonal frequency division multiplexing (OFDM) with various FFT sizes. The instructions comprise interleaving subcarriers of one or more interlaces in a bit reversal fashion, and interleaving the one or more interlaces in the bit reversal fashion.

Yet another aspect of the present disclosure is directed to an apparatus for interleaving in a wireless communication system utilizing orthogonal frequency division multiplexing (OFDM) with various FFT sizes. The apparatus comprises means for interleaving subcarriers of one or more interlaces in a bit reversal fashion, and means for interleaving the one or more interlaces in the bit reversal fashion.

BRIEF DESCRIPTION OF THE DRAWINGS

The features, nature and advantages of the present disclosure will become more apparent from the detailed description set forth below when taken in conjunction with the drawings in which like reference characters identify correspondingly throughout and wherein.

DETAILED DESCRIPTION

Figure 1:
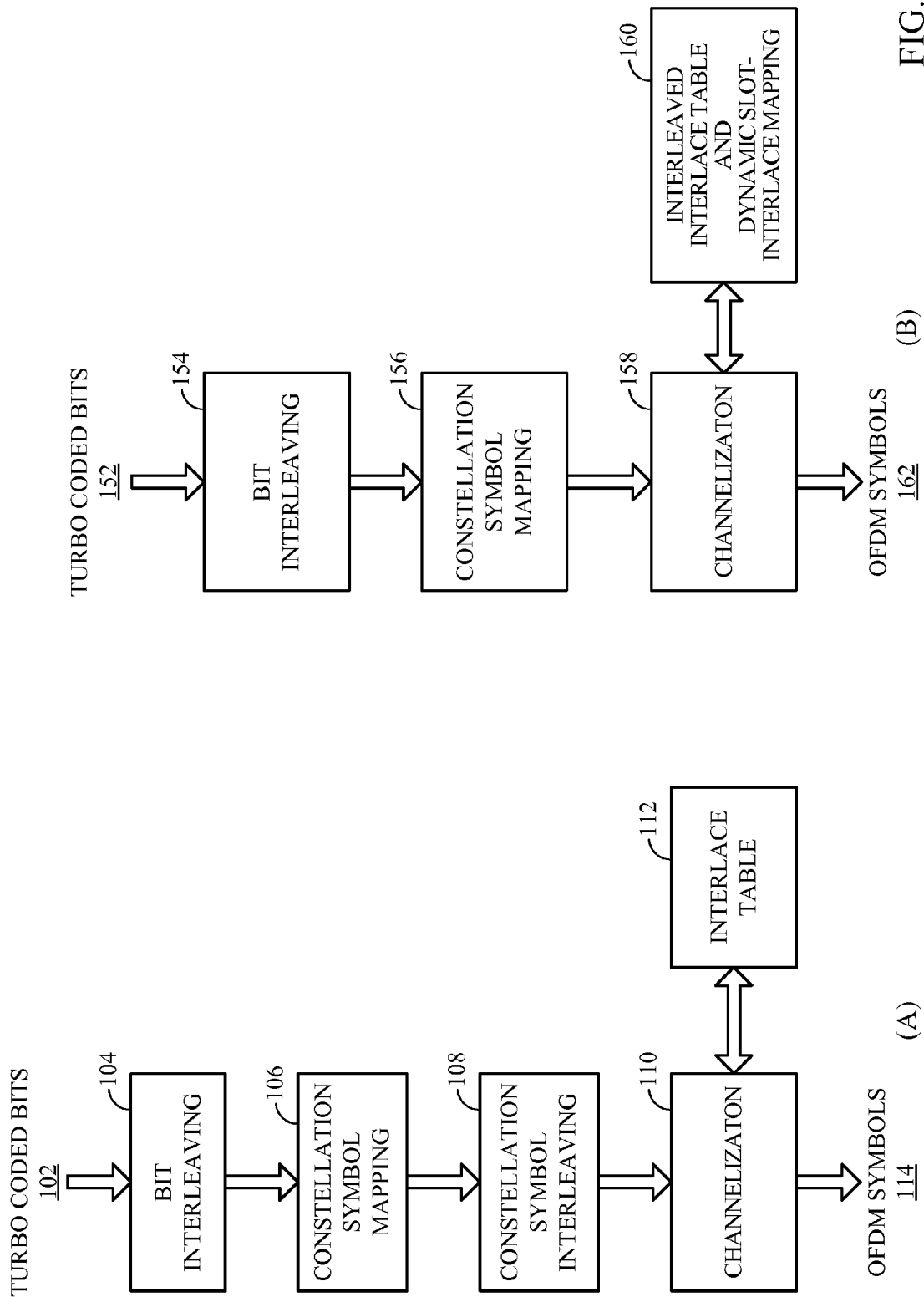
FIG. 1a shows a channel interleaver in accordance with an aspect.
FIG. 1b shows a channel interleaver in accordance with another aspect.

In the following detailed description, numerous specific details are set forth to provide a full understanding of the subject technology. It will be obvious, however, to one ordinarily skilled in the art that the subject technology may be practiced without some of these specific details. In other instances, well-known structures and techniques have not been shown in details so as not to obscure the subject technology.

The word "exemplary" is used herein to mean "serving as an example or illustration." Any aspect or design described herein as "exemplary" is not necessarily to be construed as preferred or advantageous over other aspects or designs.

Reference will now be made in detail to aspects of the subject technology, examples of which are illustrated in the accompanying drawings, wherein like reference numerals refer to like elements throughout.

In an aspect, a channel interleaver comprises a bit interleaver and a symbol interleaver. FIGS. 1a and 1b show two types of channel interleaving schemes. Both schemes use bit interleaving and interlacing to achieve maximum channel diversity.

FIG. 1a shows a channel interleaver in accordance with an aspect. FIG. 1b shows a channel interleaver in accordance with another aspect. The interleaver of FIG. 1b uses bit-interleaver solely to achieve m-ary modulation diversity and uses a two-dimension interleaved interlace table and run-time slot-to-interlace mapping to achieve frequency diversity which provides better interleaving performance without the need for explicit symbol interleaving.

FIG. 1a shows Turbo coded bits 102 input into bit interleaving block 104. Bit interleaving block 104 outputs interleaved bits, which are input into constellation symbol mapping block 106. Constellation symbol mapping block 106 outputs constellation symbol mapped bits, which are input into constellation symbol interleaving block 108. Constellation symbol interleaving block 108 outputs constellation symbol interleaved bits into channelization block 110. Channelization block 110 interlaces the constellation symbol interleaved bits using an interlace table 112 and outputs OFDM symbols 114.

FIG. 1b shows Turbo coded bits 152 input into bit interleaving block 154. Bit interleaving block 154 outputs interleaved bits, which are input into constellation symbol mapping block 156. Constellation symbol mapping block 156 outputs constellation symbol mapped bits, which are input into channelization block 158. Channelization block 158 channelizes the constellation symbol interleaved bits using an interleaved interlace table and dynamic slot-interlace mapping 160 and outputs OFDM symbols 162.

Bit Interleaving for Modulation Diversity

Figure 2A:
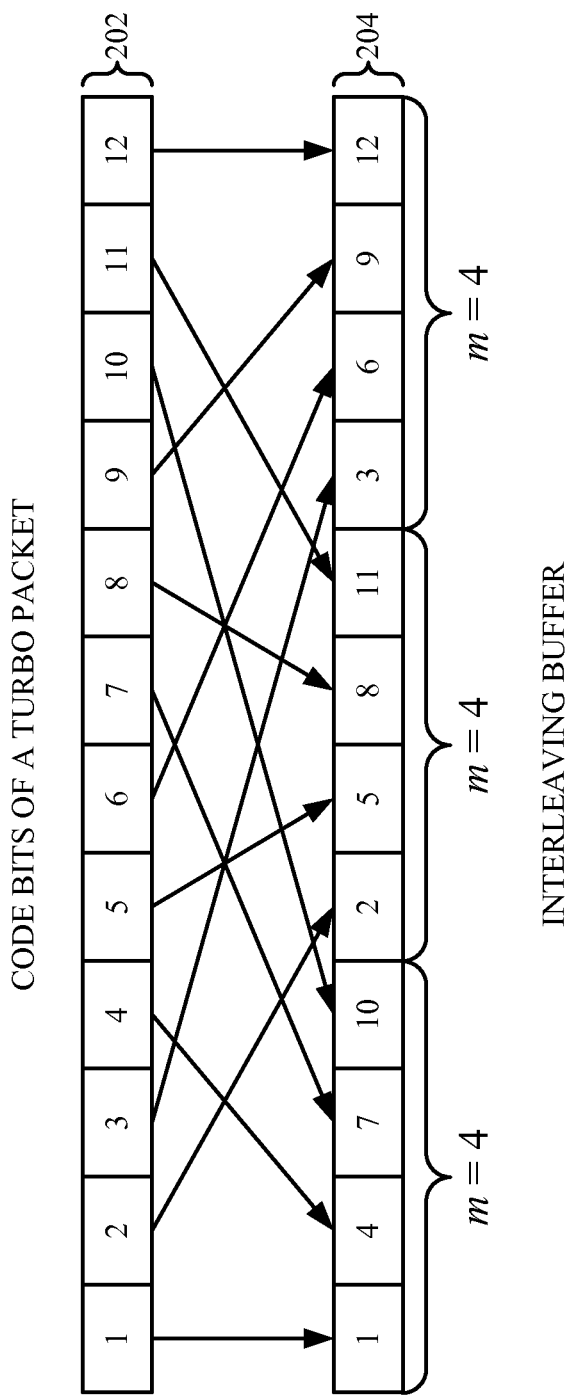
FIG. 2a shows code bits of a turbo packet placed into an interleaving buffer in accordance with an aspect.
Figure 2B:
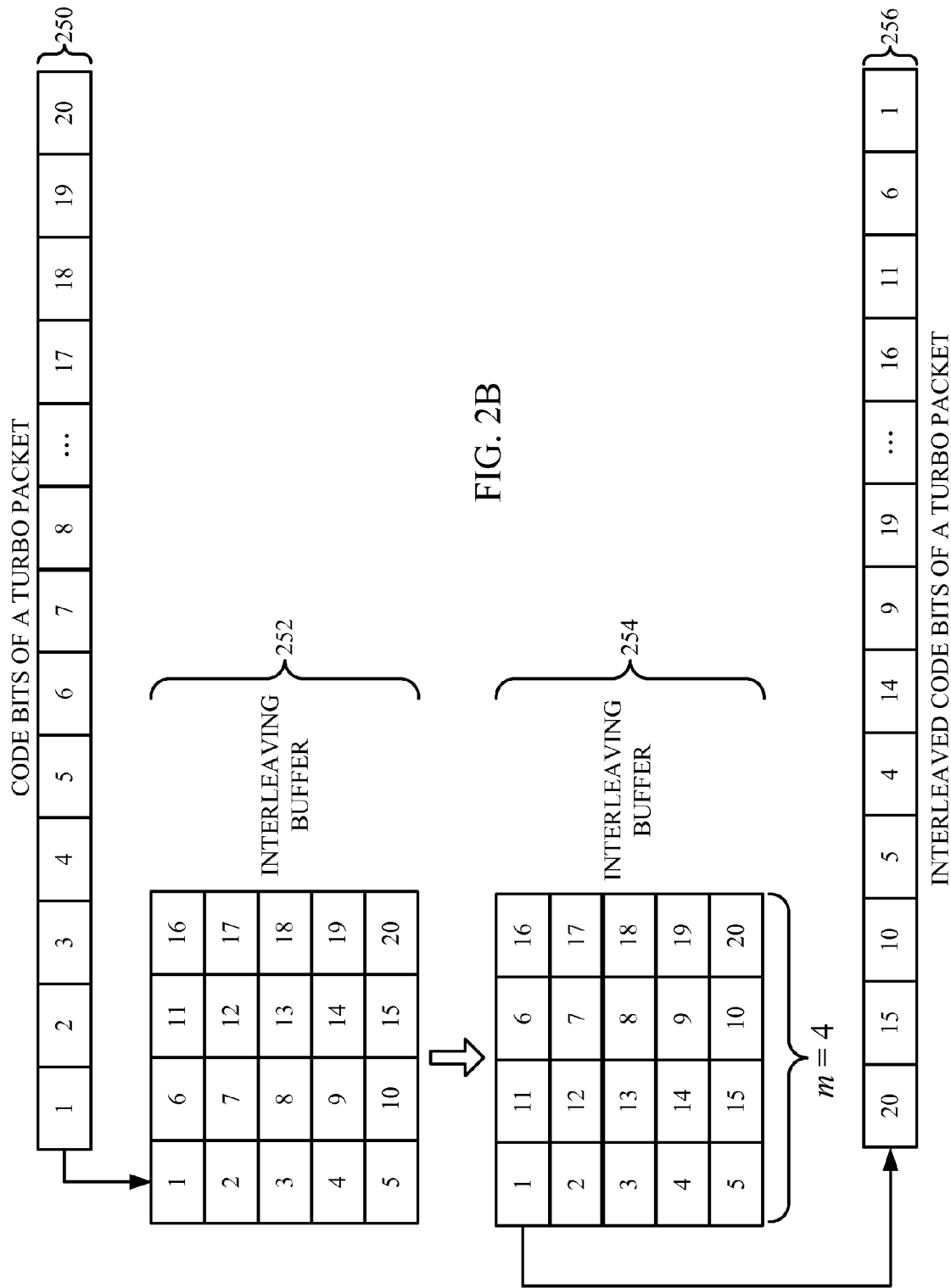
FIG. 2b shows an interleaver buffer arranged into an N/m rows by m columns matrix in accordance with an aspect.

The interleaver of FIG. 1b uses bit interleaving 154 to achieve modulation diversity. The code bits 152 of a turbo packet are interleaved in such a pattern that adjacent code bits are mapped into different constellation symbols. For example, for 2m-Ary modulation, the N bit interleaver buffer are divided into N/m blocks. Adjacent code bits are written into adjacent blocks sequentially and then are read out one by one from the beginning of the buffer to the end in the sequential order, as shown in FIG. 2a (Top). This guarantees that adjacent code bits be mapped to different constellation symbols. Equivalently, as is illustrated in FIG. 2b (Bottom), the interleaver buffer is arranged into an N/m rows by m columns matrix. Code bits are written into the buffer column by column and are read out row by row. To avoid the adjacent code bit to be mapped to the same bit position of the constellation symbol due to the fact that certain bits of a constellation symbol are more reliable than the others for 16QAM depending on the mapping, for example, the first and third bits are more reliable than the second and fourth bits, rows shall be read out from left to right and right to left alternatively.

FIG. 2a shows code bits of a turbo packet 202 placed into an interleaving buffer 204 in accordance with an aspect. FIG. 2b is an illustration of bit interleaving operation in accordance with an aspect. Code bits of a Turbo packet 250 are placed into an interleaving buffer 252 as shown in FIG. 2b. The interleaving buffer 252 is transformed by swapping the second and third columns, thereby creating interleaving buffer 254, wherein m=4, in accordance with an aspect. Interleaved code bits of a Turbo packet 256 are read from the interleaving buffer 254.

For simplicity, a fixed m=4 may be used, if the highest modulation level is 16 and if code bit length is always divisible by 4. In this case, to improve the separation for QPSK, the middle two columns are swapped before being read out. This procedure is depicted in FIG. 2b (Bottom). It would be apparent to those skilled in the art that any two columns may be swapped. It would also be apparent to those skilled in the art that the columns may be placed in any order. It would also be apparent to those skilled in the art that the rows may be placed in any order.

In another aspect, as a first step, the code bits of a turbo packet 202 are distributed into groups. Note that the aspects of both FIG. 2a and FIG. 2b also distribute the code bits into groups. However, rather than simply swapping rows or columns, the code bits within each group are shuffled according to a group bit order for each given group. Thus, the order of four groups of 16 code bits after being distributed into groups may be $\{1, 5, 9, 13\}$ $\{2, 6, 10, 14\}$ $\{3, 7, 11, 15\}$ $\{4, 8, 12, 16\}$ using a simple linear ordering of the groups and the order of the four groups of 16 code bits after shuffling may be $\{13, 9, 5, 1\}$ $\{2, 10, 6, 14\}$ $\{11, 7, 15, 3\}$ $\{12, 8, 4, 16\}$. Note that swapping rows or columns would be a regressive case of this intra-group shuffling.

Interleaved Interlace for Frequency Diversity

In accordance with an aspect, the channel interleaver uses interleaved interlace for constellation symbol interleaving to achieve frequency diversity. This eliminates the need for explicit constellation symbol interleaving. The interleaving is performed at two levels:

Within or Intra Interlace Interleaving: In an aspect, 500 subcarriers of an interlace are interleaved in a bit-reversal fashion.

Between or Inter Interlace Interleaving: In an aspect, eight interlaces are interleaved in a bit-reversal fashion.

It would be apparent to those skilled in the art that the number of subcarriers can be other than 500. It would also be apparent to those skilled in the art that the number of interlaces can be other than eight.

Note that since 500 is not power of 2, a reduced-set bit reversal operation shall be used in accordance with an aspect. The following code shows the operation:

```
vector<int> reducedSetBitRev(int n)
{
    int m=exponent(n);
    vector<int> y(n);
    for (int i=0, j=0; i<n; i++,j++)
    {
        int k;
        for (; (k=bitRev(j,m))>=n; j++);
        y[i]=k;
    }
    return y;
}
``` where n=500, m is the smallest integer such that $2^m > n$ which is 8, and bitRev is the regular bit reversal operation.

Figure 3:
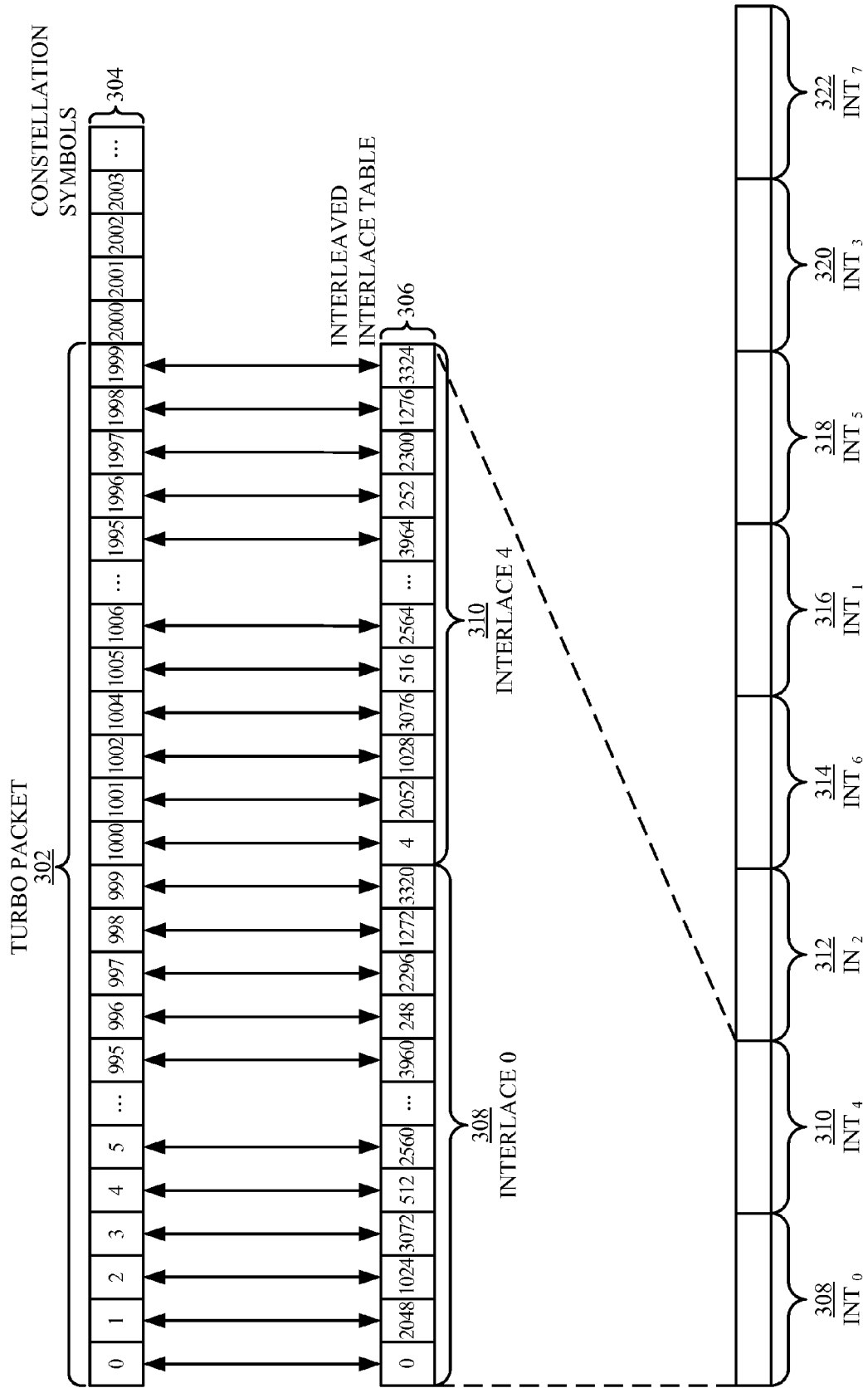
FIG. 3 illustrates an interleaved interlace table in accordance with an aspect.

The symbols of the constellation symbol sequence of a data channel is mapped into the corresponding subcarriers in a sequential linear fashion according to the assigned slot index, determined by a Channelizer, using the interlace table as is depicted in FIG. 3, in accordance with an aspect.

FIG. 3 illustrates an interleaved interlace table in accordance with an aspect. Turbo packet 302, constellation symbols 304, and interleaved interlace table 306 are shown. Also shown are interlace 3 (308), interlace 4 (310), interlace 2 (312), interlace 6 (314), interlace 1 (316), interlace 5 (318), interlace 3 (320), and interlace 7 (322).

In an aspect, one out of the eight interlaces is used for pilot, i.e., Interlace 2 and Interlace 6 is used alternatively for pilot. As a result, the Channelizer can use seven interlaces for scheduling. For convenience, the Channelizer uses Slot as a scheduling unit. A slot is defined as one interlace of an OFDM symbol. An Interlace Table is used to map a slot to a particular interlace. Since eight interlaces are used, there are then eight slots. Seven slots will be set aside for use for Channelization and one slot for Pilot. Without loss of generality, Slot 0 is used for the Pilot and Slots 1 to 7 are used for Channelization, as is shown in FIG. 4 where the vertical axis is the slot index 402, the horizontal axis is the OFDM symbol index 404 and the bold-faced entry is the interlace index assigned to the corresponding slot at an OFDM symbol time.

Figure 4:
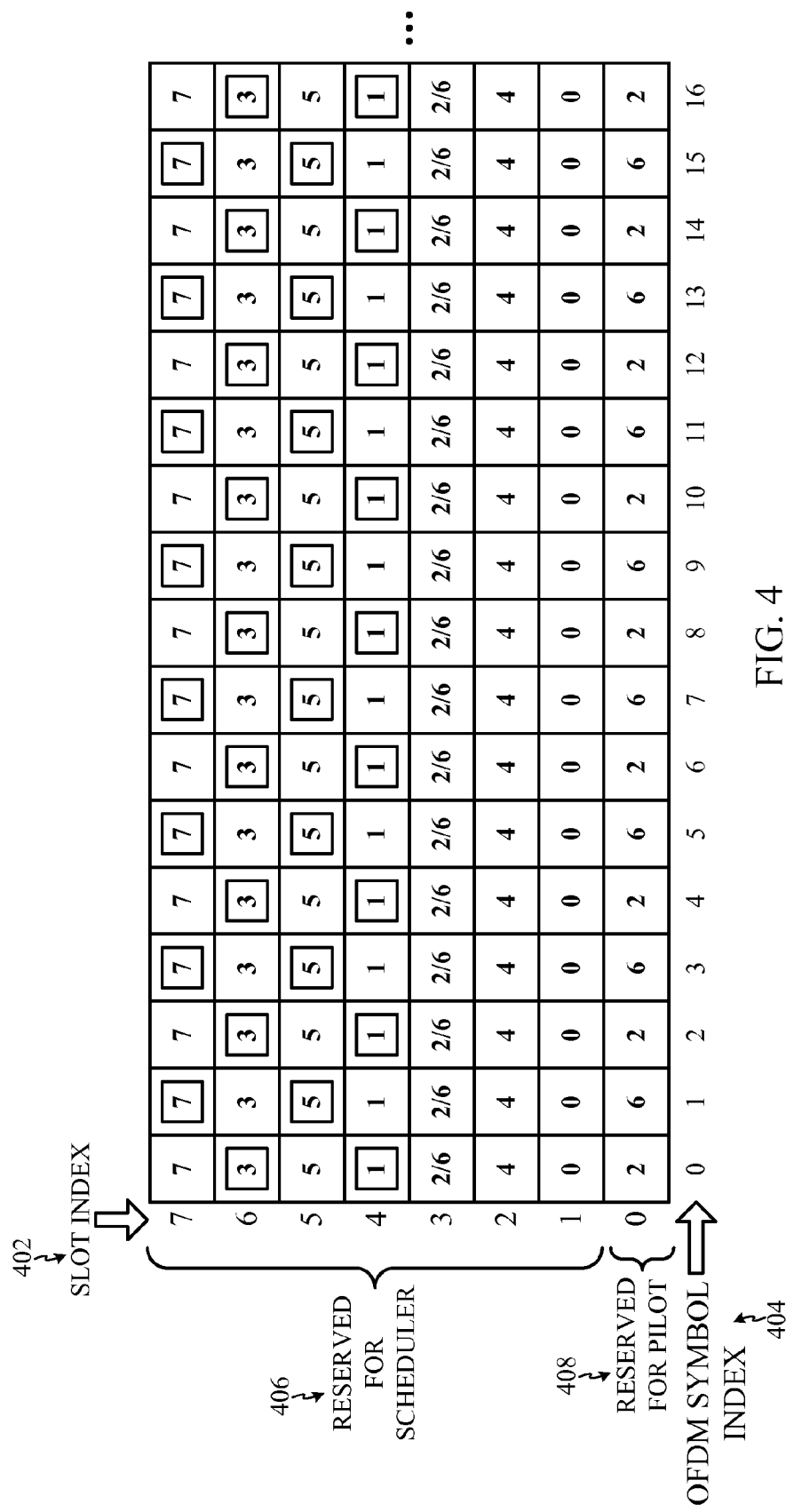
FIG. 4 shows a channelization diagram in accordance with an aspect.

FIG. 4 shows a channelization diagram in accordance with an aspect. FIG. 4 shows the slot indices reserved for the scheduler 406 and the slot index reserved for the Pilot 408. The bold faced entries are interlace index numbers. The number with square is the interlace adjacent to pilot and consequently with good channel estimate.

The number surrounded with a square is the interlace adjacent to the pilot and consequently with good channel estimate. Since the Scheduler always assigns a chunk of contiguous slots and OFDM symbols to a data channel, it is clear that due to the inter-interlace interleaving, the contiguous slots that are assigned to a data channel will be mapped to discontinuous interlaces. More frequency diversity gain can then be achieved.

However, this static assignment (i.e., the slot to physical interlace mapping table[1] does not change over time) does suffer one problem. That is, if a data channel assignment block (assuming rectangular) occupies multiple OFDM symbols, the interlaces assigned to the data channel does not change over the time, resulting in loss of frequency diversity. The remedy is simply cyclically shifting the Scheduler interlace table (i.e., excluding the Pilot interlace) from OFDM symbol to OFDM symbol.

[1] The Scheduler slot table does not include the Pilot slot.

Figure 5:
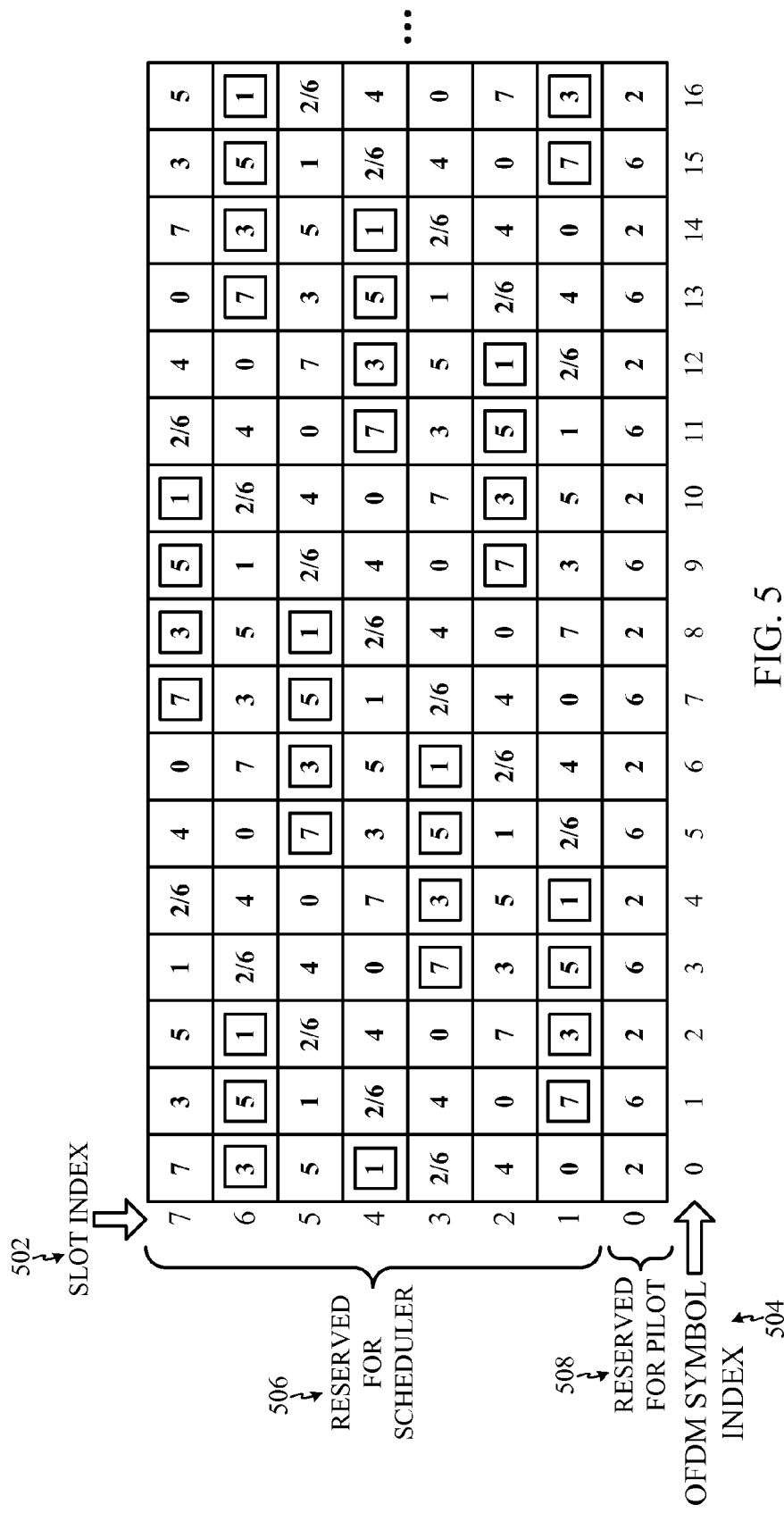
FIG. 5 shows a channelization diagram with all one's shifting sequence resulting in long runs of good and poor channel estimates for a particular slot, in accordance with an aspect.

FIG. 5 depicts the operation of shifting the Scheduler interlace table once per OFDM symbol. This scheme successfully destroys the static interlace assignment problem, i.e., a particular slot is mapped to different interlaces at different OFDM symbol time.

FIG. 5 shows a channelization diagram with all one's shifting sequence resulting in long runs of good and poor channel estimates for a particular slot 502, in accordance with an aspect. FIG. 5 shows the slot indices reserved for the scheduler 506 and the slot index reserved for the Pilot 508. Slot symbol index 504 is shown on the horizontal axis.

Figure 6:
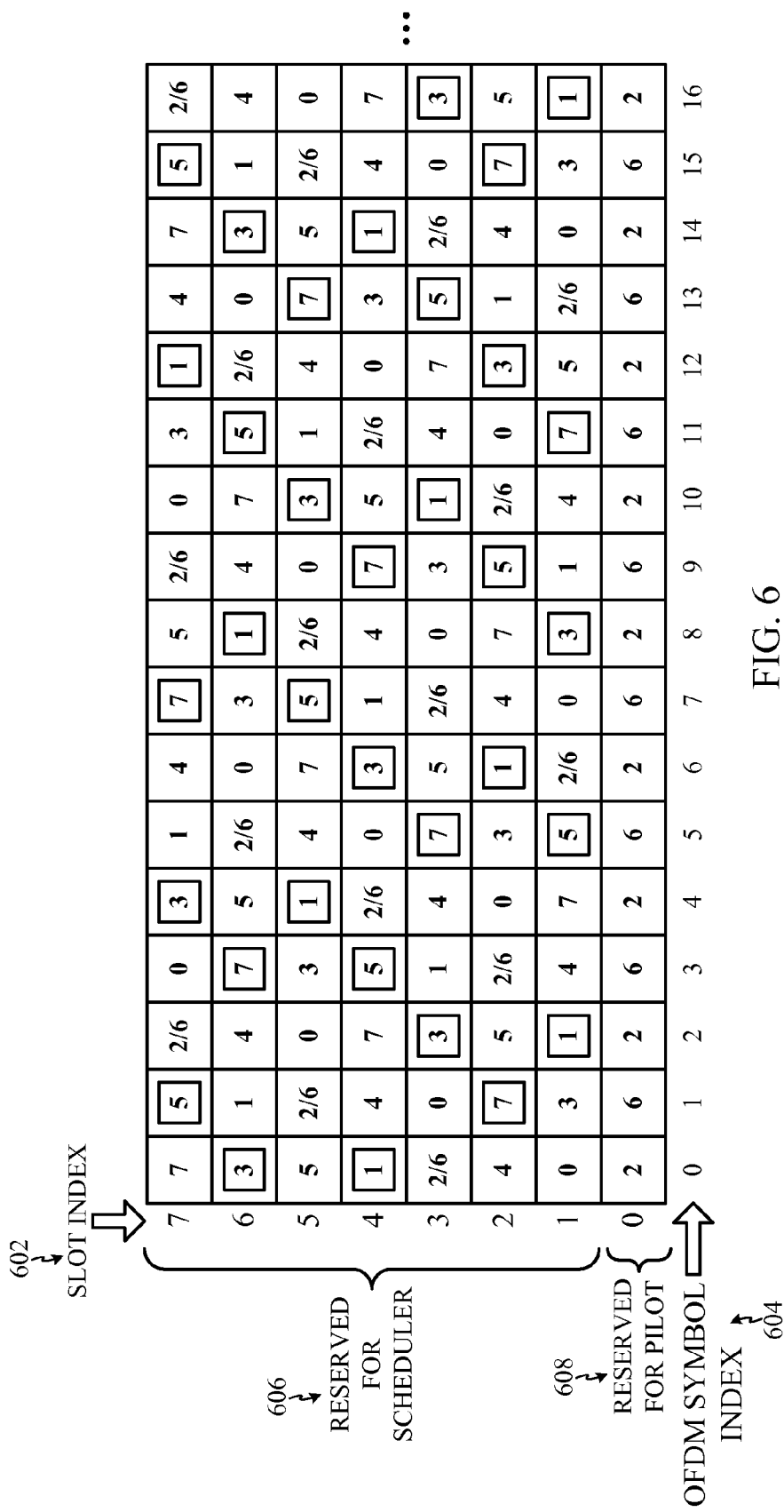
FIG. 6 shows a Channelization diagram with all two's shifting sequence resulting in evenly spread good and poor channel estimate interlaces.

However, it is noticed that slots are assigned four continuous interlaces with good channel estimates followed by long runs of interlaces with poor channel estimates in contrast to the preferred patterns of short runs of good channel estimate interlaces and short runs of interlaces with poor channel estimates. In the figure, the interlace that is adjacent to the pilot interlace is marked with a square. A solution to the long runs of good and poor channel estimates problem is to use a shifting sequence other than the all one's sequence. There are many sequences can be used to fulfill this task. The simplest sequence is the all two's sequence, i.e., the Scheduler interlace table is shifted twice instead of once per OFDM symbol. The result is shown in FIG. 6 which significantly improves the Channelizer interlace pattern. Note that this pattern repeats every 2×7=14 OFDM symbols, where 2 is the Pilot interlace staggering period and 7 is the Channelizer interlace shifting period.

To simplify the operation at both transmitters and receivers, a simple formula can be used to determine the mapping from slot to interlace at a given OFDM symbol time $$i = \mathfrak{R}'\{(N-((R \times t) \% N)+s-1) \% N\}$$

where

N=I−1 is the number of interlaces used for traffic data scheduling, where I is the total number of interlaces;

i∈{0, 1, . . . , I−1}, excluding the pilot interlace, is the interlace index that Slot s at OFDM symbol t maps to;

t=0, 1, . . . , T−1 is the OFDM symbol index in a super frame, where T is the total number of OFDM symbols in a frame[2];

[2]OFDM symbol index in a superframe instead of in a frame gives additional diversity to frames since the number of OFDM symbols in a frame in the current design is not divisible by 14.

s=1, 2, . . . , S−1s is the slot index where S is the total number of slots;

R is the number of shifts per OFDM symbol;

$\mathfrak{R}'$ is the reduced-set bit-reversal operator. That is, the interlace used by the Pilot shall be excluded from the bit-reversal operation.

Example: In an aspect, I=8, R=2. The corresponding Slot-Interlace mapping formula becomes $$i = \mathfrak{R}'\{(7-((2 \times t) \% 7)+s-1) \% 7\}$$

where $\mathfrak{R}'$ corresponds to the following table:

| x⇒$\mathfrak{R}'$\{x\} |
|---|
| 0⇒ 0 |
| 1⇒ 4 |
| 2⇒ 2 or 6 |
| 3⇒ 1 |
| 4⇒ 5 |
| 5⇒ 3 |
| 6⇒ 7 |

This table can be generated by the following code:

```
int reducedSetBitRev(int x, int exclude, int n)
{
    int m=exponent(n);
    int y;
    for (int i=0; j=0; i<=x; i++, j++)
    {
        for (; (y=bitRev(j, m))==exclude; j++);
    }
    return y;
}
``` where m=3 and bitRev is the regular bit reversal operation.

For OFDM symbol t=11, Pilot uses Interlace 6. The mapping between Slot and Interlace becomes:

Slot 1 maps to interlace of $\mathfrak{R}'\{(7-(2 \times 11) \%7+1-1) \%7\} = \mathfrak{R}\{6\}=7$;

Slot 2 maps to interlace of $\mathfrak{R}'\{(7-(2 \times 11) \%7+2-1) \%7\} = \mathfrak{R}\{0\}=0$;

Slot 3 maps to interlace of $\mathfrak{R}'\{(7-(2 \times 11) \%7+3-1) \%7\} = \mathfrak{R}\{1\}=4$;

Slot 4 maps to interlace of $\mathfrak{R}'\{(7-(2 \times 11) \%7+4-1) \%7\} = \mathfrak{R}\{2\}=2$;

Slot 5 maps to interlace of $\mathfrak{R}'\{(7-(2 \times 11) \%7+5-1) \%7\} = \mathfrak{R}\{3\}=1$;

Slot 6 maps to interlace of $\mathfrak{R}'\{(7-(2 \times 11) \%7+6-1) \%7\} = \mathfrak{R}\{4\}=5$;

Slot 7 maps to interlace of $\mathfrak{R}'\{(7-(2 \times 11) \%7+7-1) \%7\} = \mathfrak{R}\{5\}=3$.

The resulting mapping agrees with the mapping in FIG. 6. FIG. 6 shows a Channelization diagram with all two's shifting sequence resulting in evenly spread good and poor channel estimate interlaces.

Foregoing aspects of the present disclosure assume an OFDM system with 4K subcarriers (i.e., 4K FFT size). However, aspects of the present disclosure are capable of operation using FFT sizes of, for example, 1K, 2K and 8K to complement the existing 4K FFT size. As a possible advantage of using multiple OFDM systems, 4K or 8K could be used in VHF; 4K or 2K could be used in L-band; 2K or 1K could be used in S-band. Different FFT sizes could be used in different RF frequency bands, in order to support different cell sizes & Doppler frequency requirements. It is noted, however, that the aforementioned FFT sizes are merely illustrative examples of various OFDM systems, and the present disclosure is not limited to only 1K, 2K, 4K and 8K FFT sizes.

It is also important to note that the notion of slot, as 500 modulation symbols, is preserved across all FFT sizes. Further, an interlace corresponds to ⅛th of the active sub-carriers, across all FFT sizes. Accounting for guard sub-carriers, an interlace is 125, 250, & 1000 sub-carriers, respectively, for the 1K, 2K, & 8K FFT sizes. It follows that a slot then occupies 4, 2, & ½ of an interlace for the 1K, 2K, & 8K FFT sizes, respectively. For the 1K & 2K FFT sizes, the interlaces corresponding to a slot may be, for example, in consecutive OFDM symbols. The slot to interlace map discussed for the 4K FFT size also applies to the other FFT sizes, by running the map once per OFDM symbol period for the data slots.

To illustrate mapping slot buffer modulation symbols to interlace sub-carriers, regardless of FFT size of the OFDM system, aspects of the present disclosure may perform the following procedures using 1K, 2K, 4K and 8K FFT sizes, respectively. It is noted, however, that the present disclosure is not limited to the specific techniques described herein, and one of ordinary skill in the art would appreciate that equivalent methods could be implemented for mapping slot buffer modulation symbols to interlace sub-carriers without departing from the scope of the claimed invention.

Figure 8:
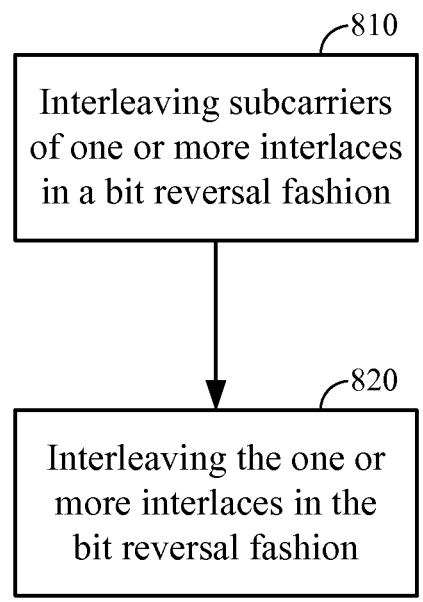
FIG. 8 shows a method for interleaving in a wireless communication system utilizing orthogonal frequency division multiplexing (OFDM) with various FFT sizes, according to an aspect of the present disclosure.

Referring now to FIG. 8, at operation 810 subcarriers of one or more interlaces are interleaved in a bit reversal fashion. From operation 810, the process moves to operation 820 where the one or more interlaces are interleaved.

Figure 9:
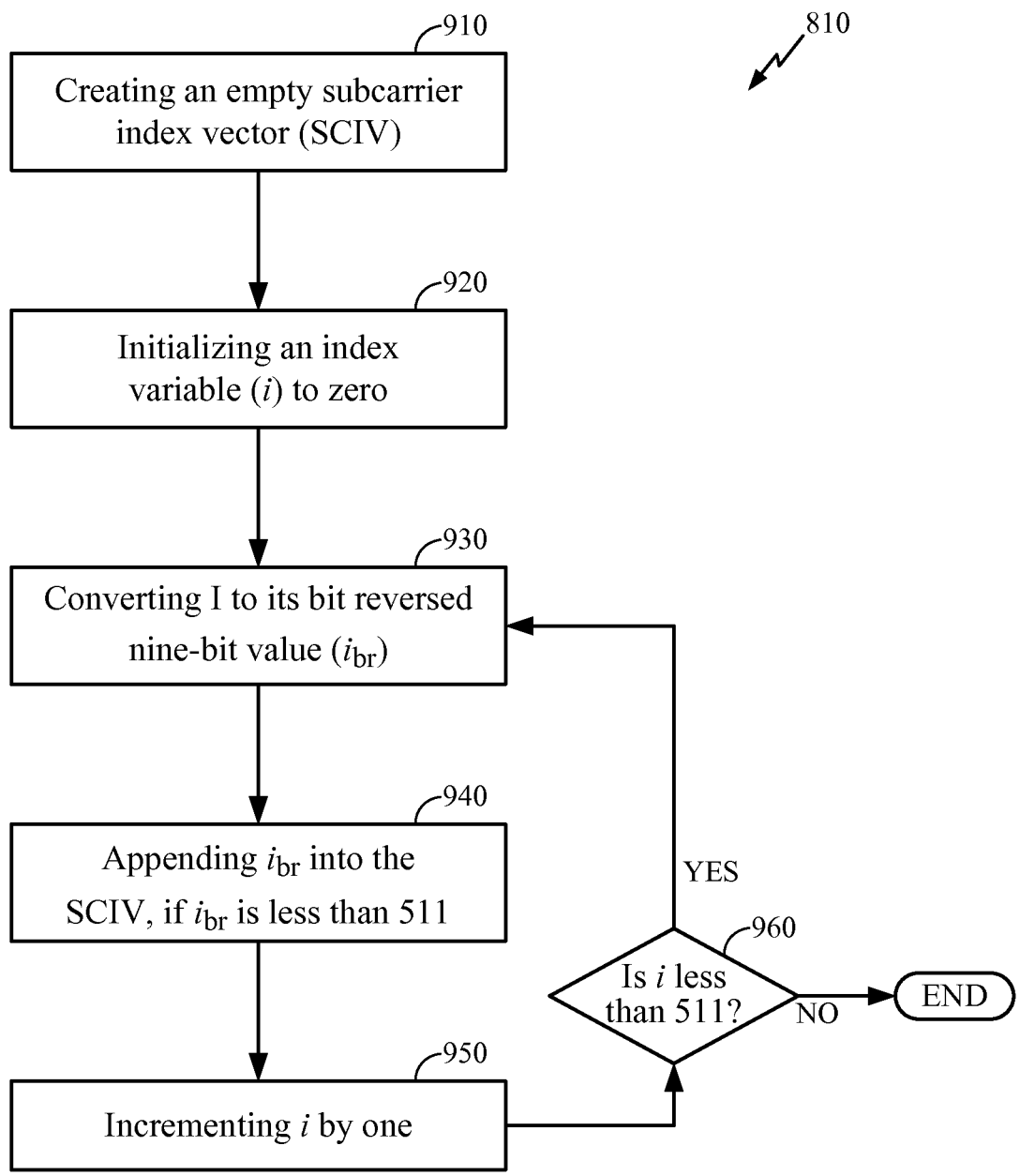
FIG. 9 shows a method of interleaving subcarriers of one or more interlaces in a bit reversal fashion, according to an aspect of the present disclosure.

FIG. 9 depicts the operation of interleaving one or more interlaces in a bit reversal fashion, according to an aspect of the present disclosure. As an example, first the 500 modulation symbols in each allocated slot may be sequentially assigned to 500 interlace sub-carriers using a Sub-carrier Index Vector (SCIV) of length 500. It is noted that the slot size of 500 modulation symbols remains constant regardless of the FFT size of the OFDM system. The Sub-carrier Index Vector is formed as per the following procedure:

Create an empty Sub-carrier Index Vector (SCIV) (910);

Let i be an index variable in the range (i∈{0, 1, . . . , 511}), and initialize i to 0 (920);

Represent i by its 9-bit value $i_b$ (930);

Bit reverse $i_b$ and denote the resulting value as $i_{br}$. If $i_{br}<500$, then append $i_{br}$ to the SCIV (940); and If i<511, then increment i by 1 (950) and go to the function of representing i by its 9-bit value $i_b$. (960)

SCIV needs to be computed only once and can be used for all data slots. The aforementioned procedure for generating the SCIV constitutes a punctured 9-bit reversal.

Next, the modulation symbols in a data slot are then mapped to an interlace sub-carrier as per the following procedures for 1K, 2K, 4K and 8K FFT sizes, respectively: For the 1K FFT size, let $[I_0(s), I_1(s), I_2(s), I_3(s)]$ denote the interlaces in four consecutive OFDM symbols mapped to slot s. The $i^{th}$ complex modulation symbol (where $i \in \{0, 1, \ldots, 499\}$) shall be mapped to the $j^{th}$ sub-carrier of interlace $I_k(s)$, where $$k = BR_2(SCIV[i] \bmod 4), \quad j = \left\lfloor \frac{SCIV[i]}{4} \right\rfloor$$

where $BR_2(*)$ is the bit reversal operation for two bits, i.e., $BR_2(0)=0$, $BR_2(1)=2$, $BR_2(2)=1$, $BR_2(3)=3$. The two bit reversal operation makes the mapping equivalent to the one generated by the following algorithm: 1) Divide each slot into four equal groups, with the first group consisting of the first 125 modulation symbols, the second group with the next 125 modulation symbols, and so on; 2) Map the modulation symbols in group k (where k=0, 1, 2, 3) to sub-carriers in interlace $I_k(s)$ using a sub-carrier interlace vector (SCIV) of length 125, generated using a punctured 8 bit reversal instead of a punctured 9 bit reversal.

For the 2K FFT size, let $[I_0(s), I_1(s)]$ denote the interlaces in two consecutive OFDM symbols that are mapped to slot s. Then the $i^{th}$ complex modulation symbol (where $i \in \{0, 1, \ldots, 499\}$) shall be mapped to the $j^{th}$ sub-carrier of interlace $I_k(s)$, where k=SCIV[i] mod 2, $$j = \left\lfloor \frac{SCIV[i]}{2} \right\rfloor$$

This mapping is equivalent to the following algorithm: 1) Divide each slot into two equal groups, with the first group consisting of the first 250 modulation symbols, the second group with the next 250 modulation symbols. 2) Map the modulation symbols in group k where k=0, 1) to sub-carriers in interlace $I_k(s)$ using a sub-carrier interlace vector (SCIV) of length 250, generated using a punctured 8 bit reversal instead of a punctured 9 bit reversal.

For the 4K FFT size, the $i^{th}$ complex modulation symbol (where $i \in \{0, 1, \ldots, 499\}$) shall be mapped to the interlace sub-carrier with index SCIV[i].

For the 8K FFT size, the $i^{th}$ complex modulation symbol (where $i \in \{0, 1, \ldots, 499\}$) shall be mapped to the $j^{th}$ sub-carrier of the interlace, where $$j = \begin{cases} 2 \times SCIV[i], & \text{if the slot belongs to an odd } MAC \text{ time unit} \\ 2 \times SCIV[i] + 1, & \text{if the slot belongs to an even } MAC \text{ time unit} \end{cases}$$

In accordance with aspects of the present disclosure, an interleaver has the following features:

The bit interleaver is designed to taking advantage of m-Ary modulation diversity by interleaving the code bits into different modulation symbols;

The "symbol interleaving" designed to achieve frequency diversity by INTRA-interlace interleaving and INTER-interlace interleaving; and Additional frequency diversity gain and channel estimation gain are achieved by changing the slot-interlace mapping table from OFDM symbol to OFDM symbol. A simple rotation sequence is proposed to achieve this goal.

Figure 7:
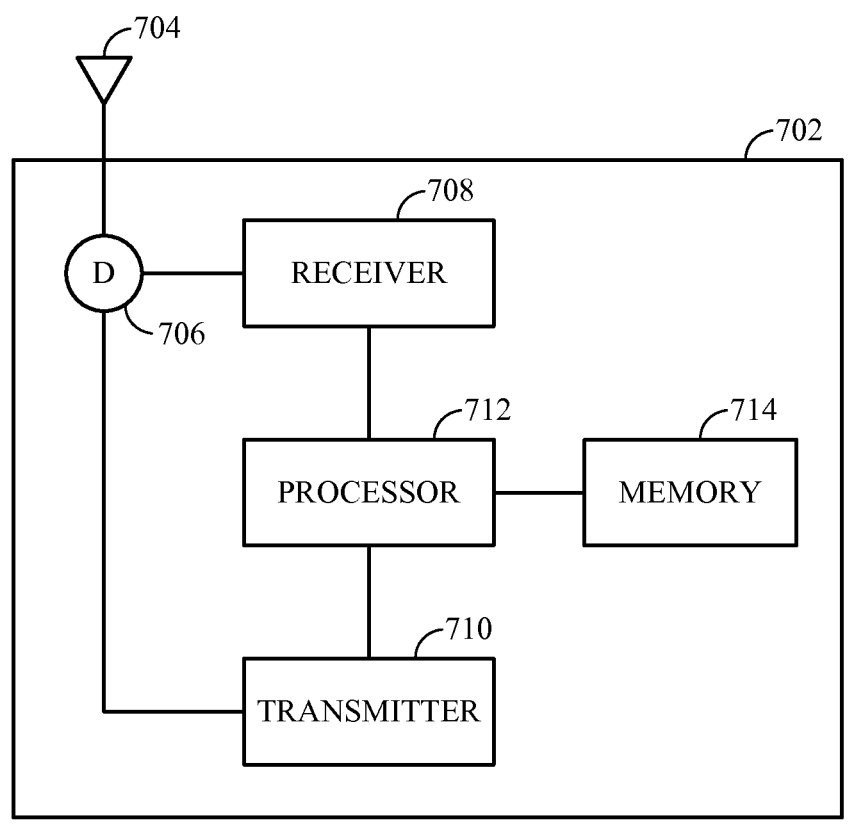
FIG. 7 shows a wireless device configured to implement interleaving in accordance with an aspect.

FIG. 7 shows a wireless device configured to implement interleaving in accordance with an aspect. Wireless device 702 comprises an antenna 704, duplexer 706, a receiver 708, a transmitter 710, processor 712, and memory 714. Processor 712 is capable of performing interleaving in accordance with an aspect. The processor 712 uses memory 714 for buffers or data structures to perform its operations.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the scope of the claimed invention. Thus, the present disclosure is not intended to be limited to the aspects shown herein but is to be accorded the widest scope consistent with the principles and novel features disclosed herein.

What is claimed is:

1. A method for interleaving in a wireless communication system utilizing orthogonal frequency division multiplexing (OFDM) with various FFT sizes, comprising:
in a processor:
interleaving subcarriers of one or more interlaces in a bit reversal fashion such that mapped symbols of corresponding subcarriers are interleaved into a first order; and
interleaving the one or more interlaces such that the mapped symbols are interleaved into a second order.

2. The method of claim 1, wherein the bit reversal fashion is a reduce-set bit reversal operation if the number of subcarriers is not a power of two.

3. The method of claim 2, wherein said interleaving subcarriers comprises:
creating an empty subcarrier index vector (SCIV);
initializing an index variable (i) to zero;
converting i to its bit reversed nine-bit value (ibr);
appending ibr into the SCIV, if ibr is less than 511; and
incrementing i by one and repeat the converting, appending and incrementing, if is less than 511.

4. The method of claim 1, wherein the interleaving subcarriers of one or more interlaces in a bit reversal fashion involves mapping symbols of a constellation symbol sequence into corresponding subcarriers in a sequential linear fashion according to an assigned slot index using an interlace table.

5. The method of claim 1, wherein the interleaving the one or more interlaces occurs every OFDM symbol.

6. An apparatus for interleaving in a wireless communication system utilizing orthogonal frequency division multiplexing (OFDM) with various FFT sizes, comprising:
a processor configured to interleave subcarriers of one or more interlaces in a bit reversal fashion such that mapped symbols of corresponding subcarriers are interleaved into a first order; and
a processor configured to interleave the one or more interlaces in the bit reversal fashion such that the mapped symbols are interleaved into a second order.

7. The apparatus of claim 6, wherein the bit reversal fashion is a reduce-set bit reversal operation if the number of subcarriers is not a power of two.

8. The apparatus of claim 6, wherein the number of interlaces is eight.

9. The apparatus of claim 6, wherein the processor configured to interleave subcarriers of one or more interlaces in a bit reversal fashion is further configured to map symbols of a constellation symbol sequence into corresponding subcarriers in a sequential linear fashion according to an assigned slot index using an interlace table.

10. The apparatus of claim 6, wherein the interleaving the one or more interlaces occurs every OFDM symbol.

11. A processor executing instructions in a wireless communication system utilizing orthogonal frequency division multiplexing (OFDM) with various FFT sizes, the instructions comprising:
interleaving subcarriers of one or more interlaces in a bit reversal fashion such that mapped symbols of corresponding subcarriers are interleaved into a first order; and
interleaving the one or more interlaces in the bit reversal fashion such that the mapped symbols are interleaved into a second order.

12. The processor of claim 11, wherein the bit reversal fashion is a reduce-set bit reversal operation if the number of subcarriers is not a power of two.

13. The processor of claim 11, wherein the number of interlaces is eight.

14. The processor of claim 11, wherein the interleaving subcarriers of one or more interlaces in a bit reversal fashion involves mapping symbols of a constellation symbol sequence into corresponding subcarriers in a sequential linear fashion according to an assigned slot index using an interlace table.

15. The processor of claim 11, wherein the interleaving the one or more interlaces occurs every OFDM symbol.

16. An apparatus for interleaving in a wireless communication system utilizing orthogonal frequency division multiplexing (OFDM) with various FFT sizes, comprising:
means for interleaving subcarriers of one or more interlaces in a bit reversal fashion such that mapped symbols of corresponding subcarriers are interleaved into a first order; and
means for interleaving the one or more interlaces in the bit reversal fashion such that the mapped symbols are interleaved into a second order.

17. The apparatus of claim 16, wherein the bit reversal fashion is a reduce-set bit reversal operation if the number of subcarriers is not a power of two.

18. The apparatus of claim 16, wherein the number of interlaces is eight.

19. The apparatus of claim 16, wherein the means for interleaving subcarriers of one or more interlaces in a bit reversal fashion comprises means for mapping symbols of a constellation symbol sequence into corresponding subcarriers in a sequential linear fashion according to an assigned slot index using an interlace table.

20. The apparatus of claim 16, wherein the means for interleaving the one or more interlaces occurs every OFDM symbol.

21. A system for interleaving in a wireless communication system utilizing orthogonal frequency division multiplexing (OFDM) with various FFT sizes, comprising:
a processor configured to interleaving subcarriers of one or more interlaces in a bit reversal fashion such that mapped symbols of corresponding subcarriers are interleaved into a first order; and
a processor configured to interleave the one or more interlaces in the bit reversal fashion such that the mapped symbols are interleaved into a second order.

22. The system of claim 21, wherein the bit reversal fashion is a reduce-set bit reversal operation if the number of subcarriers is not a power of two.

23. The system of claim 22, wherein said processor configured to interleave subcarriers is further configured to:
create an empty subcarrier index vector (SCIV);
initialize an index variable (i) to zero;
convert i to its bit reversed nine-bit value (ibr);append ibr into the SCIV, if ibr is less than 511; and increment i by one and repeat the converting, appending and incrementing, if i is less than 511.

24. The system of claim 21, wherein the processor configured to interleave the one or more interlaces is further configured to:

for a 1K FFT size, map interlaces in four consecutive OFDM symbols to slot s by mapping an ith modulation symbol, where i {0, 1, . . . 499}, to a jth subcarrier of interlace Ik(s), wherein k=BR2(SCIV[i] mod 4),
j=floor(SCIV[i]/4), and
BR2(*) is a bit reversal operation for two bits.

25. The system of claim 21, wherein the processor configured to interleave the one or more interlaces is further configured to:

for a 2K FFT size, map interlaces in 2 consecutive OFDM symbols to slot s by mapping an ith modulation symbol, where i {0, 1, . . . 499}, to a jth subcarrier of interlace Ik(s), wherein k=(SCIV[i] mod 2), and
j=floor(SCIV[i]/2).

* * * * *